US008685796B2

(12) United States Patent
Kurita et al.

(10) Patent No.: US 8,685,796 B2
(45) Date of Patent: Apr. 1, 2014

(54) ELECTRONIC DEVICE AND METHOD OF MANUFACTURING THE SAME

(75) Inventors: Yoichiro Kurita, Kawasaki (JP); Koji Soejima, Kawasaki (JP); Masaya Kawano, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 966 days.

(21) Appl. No.: 11/856,730

(22) Filed: Sep. 18, 2007

(65) Prior Publication Data

US 2008/0079157 A1    Apr. 3, 2008

(30) Foreign Application Priority Data

Oct. 2, 2006 (JP) .................................. 2006-271164

(51) Int. Cl.
*H01L 21/44*    (2006.01)
(52) U.S. Cl.
USPC ........... 438/118; 438/106; 257/686; 257/700; 257/E23.001; 257/E23.011
(58) Field of Classification Search
USPC .......... 438/106, 109, 118, 126, 127; 257/686, 257/678, 700, E23.001, E23.011
See application file for complete search history.

(56) References Cited

U.S. PATENT DOCUMENTS

| 6,551,856 B1 * | 4/2003 | Lee ............................... 438/108 |
| 6,838,332 B1 * | 1/2005 | Sanchez et al. ............... 438/239 |
| 7,217,999 B1 * | 5/2007 | Honda ............................ 257/712 |
| 2004/0056344 A1 * | 3/2004 | Ogawa et al. .................. 257/686 |
| 2004/0227227 A1 * | 11/2004 | Imanaka et al. ............... 257/700 |
| 2008/0150118 A1 * | 6/2008 | Van Veen et al. ............. 257/688 |

FOREIGN PATENT DOCUMENTS

| JP | 57-7147 | 1/1982 |
| JP | 9-321408 | 12/1997 |
| JP | 11-126978 | 5/1999 |
| JP | 2001-53413 | 2/2001 |
| JP | 2001-185653 | 7/2001 |
| JP | 2003-051569 | 2/2003 |
| JP | 2003-309215 | 10/2003 |
| JP | 2005-063987 | 3/2005 |
| JP | 2005-340655 | 12/2005 |
| JP | 2005-353837 | 12/2005 |
| WO | 2005/029578 | 3/2005 |

OTHER PUBLICATIONS

Japanese Official Action mailed Feb. 8, 2011 in corresponding Japanese Application No. 2006-271164 with English translation of enclosed wavy lined portion.
Japanese Official Action—2006-271164—Dec. 27, 2011.

* cited by examiner

*Primary Examiner* — David Vu
(74) *Attorney, Agent, or Firm* — Young & Thompson

(57) ABSTRACT

The electronic device includes a first interconnect layer and a second interconnect layer. The second interconnect layer is provided on the lower surface of the first interconnect layer. The first interconnect layer includes a via plug (first conductive plug). An end face of the via plug on the side of the second interconnect layer is smaller in area than the opposite end face. The via plug is exposed on the surface of the first interconnect layer facing the second interconnect layer. An insulating resin forming the first interconnect layer is higher in thermal decomposition temperature than an insulating resin forming the second interconnect layer.

12 Claims, 16 Drawing Sheets

US 8,685,796 B2

ELECTRONIC DEVICE AND METHOD OF MANUFACTURING THE SAME

This application is based on Japanese patent application No. 2006-271164, the content of which is incorporated hereinto by reference.

BACKGROUND

1. Technical Field

The present invention relates to an electronic device, and to a method of manufacturing the same.

2. Related Art

Methods of manufacturing an electronic device so far developed include, for example, the one disclosed in JP-A No. 2003-309215. According to the manufacturing method disclosed therein, a plurality of interconnect layers is sequentially stacked on a supporting substrate to thereby form a multilayer interconnect structure, and then the supporting substrate is removed. On one of the surfaces of the multilayer interconnect structure, exposed by removing the supporting substrate, solder balls are formed so as to serve as an external electrode terminal. On the other surface of the multilayer interconnect structure, an electronic component is flip-chip mounted. Thereby the electronic device, including the multilayer interconnect structure with the electronic component mounted thereon, can be obtained.

Prior art related to the present invention also includes JP-A No. S57-7147, JP-A No. H09-321408, JP-A No. H11-126978 and JP-A No. 2001-53413, in addition to JP-A No. 2003-309215.

The present inventors have recognized as follows. In the foregoing electronic device, to achieve fine connection between the interconnect layer and the electronic component, a resin that is appropriate for micro processing has to be employed for the interconnect layer on the side of the electronic component, among the interconnect layers constituting the multilayer interconnect structure. On the other hand, it is often unnecessary to employ the resin appropriate for micro processing, for the interconnect layer on the side of the solder balls. Accordingly, from the viewpoint of the manufacturing cost of the electronic device, it is desirable to employ a relatively inexpensive resin for the interconnect layer on the solder balls side.

According to the manufacturing method disclosed in JP-A No. 2003-309215, however, the plurality of interconnect layers is sequentially formed on the supporting substrate, for forming the multilayer interconnect structure, as already described. This means that the interconnect layer on the solder balls side is formed prior to the interconnect layer on the electronic component side. Accordingly, a resin lower in thermal decomposition temperature than that used for the interconnect layer on the electronic component side cannot be employed for the interconnect layer the solder balls side. Such restriction imposes a limitation on the selection of the resin to be used for the interconnect layer on the solder balls side, thereby impeding reduction in manufacturing cost of the electronic device.

SUMMARY

In one aspect according to the present invention, there is provided a method of manufacturing an electronic device, comprising forming a first interconnect layer on a supporting substrate; removing the supporting substrate; and forming, after the removal of the supporting substrate, a second interconnect layer on a surface of the first interconnect layer on which the supporting substrate was initially provided; wherein the step of forming the second interconnect layer includes forming a first conductive plug in the first interconnect layer.

According to the method of manufacturing thus arranged, the first interconnect layer, on which the electronic component is to be mounted, is formed on the supporting substrate, and then the supporting substrate is removed before forming the second interconnect layer. Such arrangement eliminates the restriction that a resin lower in thermal decomposition temperature than that forming the first interconnect layer cannot be employed for forming the second interconnect. The method allows, therefore, employing a resin appropriate for micro processing for the first interconnect layer, while employing a relatively inexpensive resin for the second interconnect layer.

In another aspect according to the present invention, there is provided an electronic device comprising a first interconnect layer; a second interconnect layer provided on the first interconnect layer and having an external electrode terminal; and a first conductive plug provided in the first interconnect layer, and exposed on a surface of the first interconnect layer on the side of the second interconnect layer; wherein a resin forming the first interconnect layer is higher in thermal decomposition temperature than a resin forming the second interconnect layer; and an end face of the first conductive plug on the side of the second interconnect layer is larger in area than an opposite end face.

The electronic device thus constructed permits employing a resin lower in thermal decomposition temperature than that forming the first interconnect layer, for forming the second interconnect layer. Accordingly, a relatively inexpensive resin can be employed for the second interconnect layer, while a resin appropriate for micro processing is to be employed for the first interconnect layer.

Thus, the present invention provides an electronic device that enables achieving fine connection between an interconnect layer and an electronic component despite a lower cost, and a method of manufacturing such electronic device.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, embodiments of an electronic device and a method of manufacturing the same according to the present invention will be described in details, referring to the accompanying drawings. In all the drawings, same constituents are given the same numerals, and the description thereof will not be repeated.

First Embodiment

Figure 1:
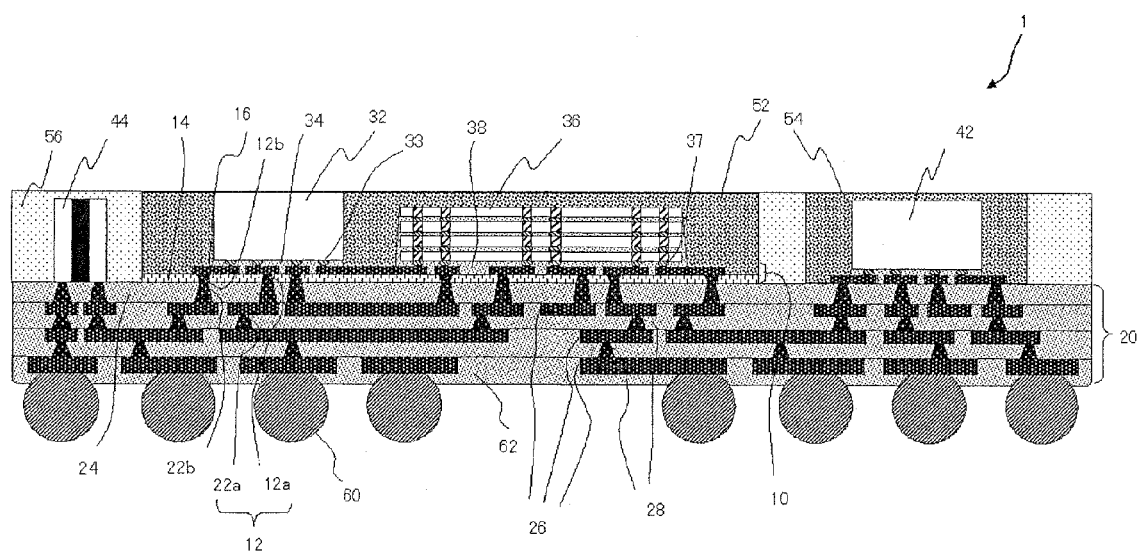
FIG. 1 is a cross-sectional view of an electronic device according to a first embodiment of the present invention.

FIG. 1 is a cross-sectional view of an electronic device according to a first embodiment of the present invention. The electronic device 1 includes an interconnect layer 10 (first interconnect layer), and an interconnect layer 20 (second interconnect layer).

The interconnect layer 10 includes via plugs 12a (first conductive plug), via plugs 12b, an insulating resin 14 and a conductor interconnect 16 (first interconnect). The via plug 12a, 12b are provided in the insulating resin 14. As is apparent from FIG. 1, the via plugs 12a are of a tapered shape, having a diameter gradually increasing toward the interconnect layer 20. Accordingly, an end face of the via plug 12a on the side of the interconnect layer 20 is larger in area than the opposite end face, i.e. the end face on the side of IC chips 32, 36 to be subsequently described. In contrast, the via plugs 12b are of a tapered shape, having a diameter gradually reducing toward the interconnect layer 20. Accordingly, an end face of the via plug 12b on the side of the interconnect layer 20 is smaller in area than the opposite end face. The via plugs 12a, 12b are exposed on the surface of the interconnect layer 10 facing the interconnect layer 20.

The conductor of the via plug 12a, 12b may be, for example, Cu, Ni, Au or Ag. The insulating resin 14 may be constituted of a polyimide resin, a polybenzoxazole (hereinafter, PBO) resin, a benzocyclobutene (BCB) resin, a cardo resin (cardo polymer) or an epoxy resin. The polyimide resin may be photosensitive or non-photosensitive. On the insulating resin 14, the conductor interconnect 16 is provided so as to be connected to the via plug 12a, 12b.

On the upper surface (first surface) of the interconnect layer 10, the IC chips 32, 36 (electronic component) are mounted. The IC chips 32, 36 are flip-chip connected to the conductor interconnect 16 via bumps 33, 37 respectively. In a gap between the IC chip 32 and the interconnect layer 10, an underfill resin 34 is loaded. Likewise, a gap between the IC chip 36 and the interconnect layer 10 is filled with an underfill resin 38. The IC chip 36 is provided in a plurality of numbers, which are stacked on each other. The IC chip 32 and the IC chip 36 may be, for example, a CPU and a stacked memory, respectively. The stacked memory is constituted of three-dimensionally stacked IC chips (memories), which are electrically connected with one another.

The IC chip 32, 36 are covered with an encapsulating resin 52 provided on the interconnect layer 10. To be more detailed, the lateral face of the IC chip 32, and the lateral and upper face of the IC chip 36 are covered with the encapsulating resin 52.

On the lower surface of the interconnect layer 10 (second surface), the interconnect layer 20 is provided. The interconnect layer 20 is larger in area than the interconnect layer 10 in a plan view, and extends to an outer region of the interconnect layer 10. In other words, the interconnect layer 20 sticks outward from the interconnect layer 10.

The interconnect layer 20 includes via plugs 22a (second conductive plug), via plugs 22b and an insulating resin 24. The via plugs 22a, 22b are provided in the insulating resin 24. The via plugs 22a, 22b are respectively connected to the via plugs 12a, 12b. The via plug 22a is integrally formed with the via plug 12a, such that the via plugs 12a, 22a constitute a via plug 12 (interlayer via plug). In other words, a portion of the via plug 12 provided in the interconnect layer 10 corresponds to the via plug 12a, and a portion provided in the interconnect layer 20 corresponds to the via plug 22a.

As is apparent from FIG. 1, the via plugs 22a, 22b are of a tapered shape, having a diameter gradually reducing toward the interconnect layer 10. Accordingly, an end face of the via plug 22a, 22b on the side of the interconnect layer 10 is smaller in area than the opposite end face, i.e. the end face on the side of solder balls 60 to be subsequently described. Also, since the via plugs 12a, 22a are integrally formed as already stated, an end face of the via plug 12a, 22a and that of the via plug 22a, 12a in contact with each other are equal in area. The conductor of the via plugs 22a, 22b may be, for example, Cu, Ni, Au or Ag as the via plugs 12a, 12b. The insulating resin 24 may be constituted of an epoxy resin, for example. The interconnection structure constituted of the interconnect layer 10 and the interconnect layer 20 serves as an interposer in the electronic device 1.

The thermal decomposition temperature of the insulating resin 14 forming the interconnect layer 10 is higher than that of the insulating resin 24 forming the interconnect layer 20. In the case of employing the PBO resin as the insulating resin 14, the thermal decomposition temperature is, for instance, 540° C. When the epoxy resin is employed as the insulating resin 24, the thermal decomposition temperature is, for instance, 310° C. The thermal decomposition temperature herein means the temperature at which the weight of the resin decreases by 5%, measured with a thermo balance at a heating rate of 10° C. per minute. Here, in the case of employing the same type of resin (for example, the epoxy resin) as the insulating resin 14, 24, the former should have a higher thermal decomposition temperature than the latter.

On the region of the interconnect layer 20 extending out of the interconnect layer 10, an IC chip 42 and a passive component 44 are mounted, as the second electronic component. The passive component 44 may be a capacitor, such as a decoupling capacitor. The IC chip 42 is covered with an encapsulating resin 54. The passive component 44 is covered with a resin 56 provided on the outwardly extending region of the interconnect layer 20. The resin 56 may be the same resin as the encapsulating resin 54, or a different resin.

The interconnect layer 20 has a multilayer interconnect structure, and includes conductor interconnects 26 formed in a plurality of layers, and via plugs 28 connecting the conductor interconnects 26 of the different layers. The interconnect layer 20 are also provided with the solder balls 60 connected to the conductor interconnect 26 of a lowermost layer. The solder balls 60 are partially buried in a solder resist 62. The solder balls 60 serve as external connection terminals of the electronic device 1.

Figure 2:
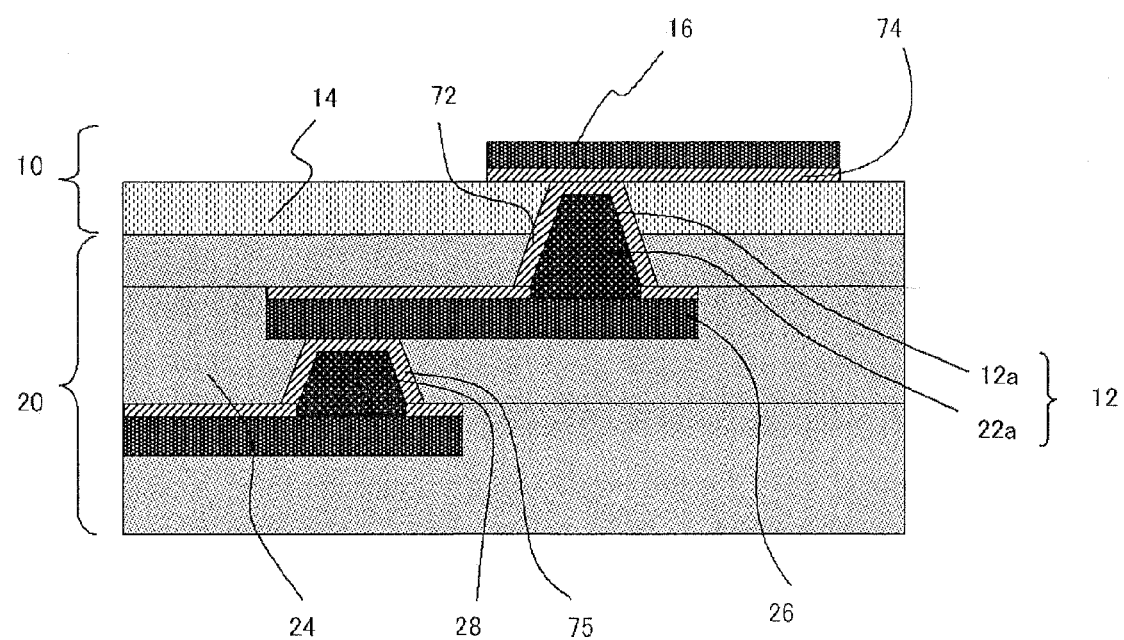
FIG. 2 is a cross-sectional view for explaining a structure around an interface between a first interconnect layer and a second interconnect layer.

Referring to FIG. 2, an example of a structure around an interface between the interconnect layer 10 and the interconnect layer 20 will be described. In this example, an adhesion metal layer 72 (second adhesion metal layer) is provided so as to cover the via plug 12. In other words, the adhesion metal layer 72 collectively covers the via plugs 12a, 22a. Also, on the surface of the conductor interconnect 16 in contact with the via plug 12a, an adhesion metal layer 74 (first adhesion metal layer) is provided. The adhesion metal layer 72 is in contact with the adhesion metal layer 74 on the via plug 12a. Accordingly, the adhesion metal layer 72 has one portion disposed in contact with the insulating resin 14 and another portion with the adhesion metal layer 74. In addition, an adhesion metal layer 75 is provided so as to cover the via plug 28. The adhesion metal layer 75 is in contact with the conductor interconnect 26, on the via plug 28.

It is preferable that the adhesion metal layers 72, 74 are constituted of a film containing Ti (for example, a Ti, TiN or TiW film), or of a Cr film.

Figure 3A:
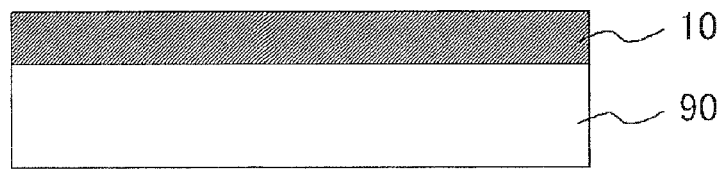
FIGS. 3A to 3E are cross-sectional views sequentially showing a manufacturing method of the electronic device according to the first embodiment.

Referring to FIGS. 3A to 7B, a method of manufacturing the electronic device 1 will be described, as the first embodiment of the method of manufacturing an electronic device according to the present invention. Before stepping into details, an outline of the manufacturing method will be described, referring to FIGS. 3A to 3E. Firstly, as shown in FIG. 3A, the interconnect layer 10 is formed on a supporting substrate 90 (step of forming a first interconnect layer). The supporting substrate 90 may be a silicon substrate, a ceramic substrate, a glass substrate or a metal substrate.

Figure 3B:
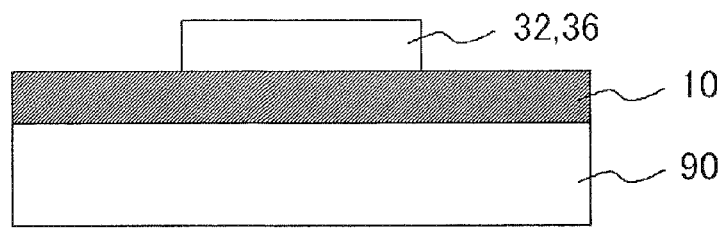
Figure 3C:
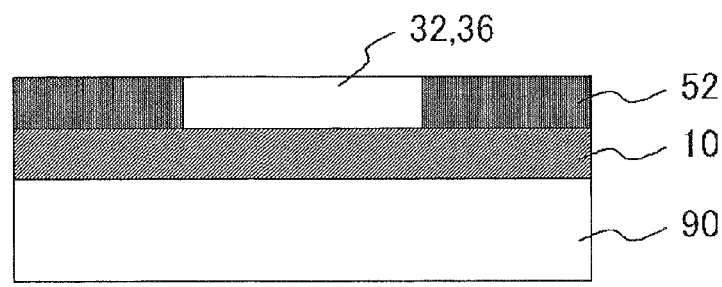
Figure 3D:
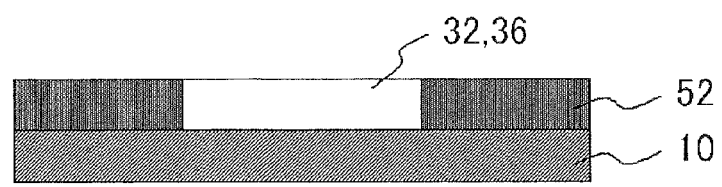
Figure 3E:
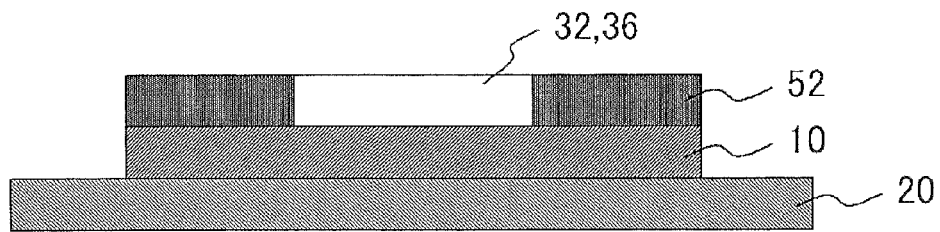

Then as shown in FIG. 3B, the IC chips 32, 36 are mounted on the interconnect layer 10 (step of mounting an electronic component). As shown in FIG. 3C, further the encapsulating resin 52 is formed on the interconnect layer 10, so as to cover the IC chips 32, 36 (step of forming an encapsulating resin). Then as shown in FIG. 3D, the supporting substrate 90 is removed (step of removing the supporting substrate). After that, as shown in FIG. 3E the interconnect layer 20 is formed on the lower surface of the interconnect layer 10 (step of forming a second interconnect layer). Finally, the solder balls 60 are formed although the drawing is not provided, so that the electronic device 1 shown in FIG. 1 is obtained.

Figure 4A:
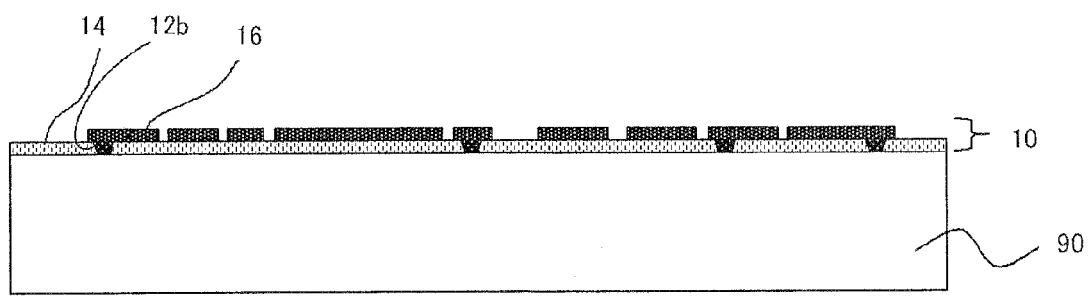
FIGS. 4A and 4B are cross-sectional views sequentially showing the manufacturing method of the electronic device according to the first embodiment.
Figure 4B:
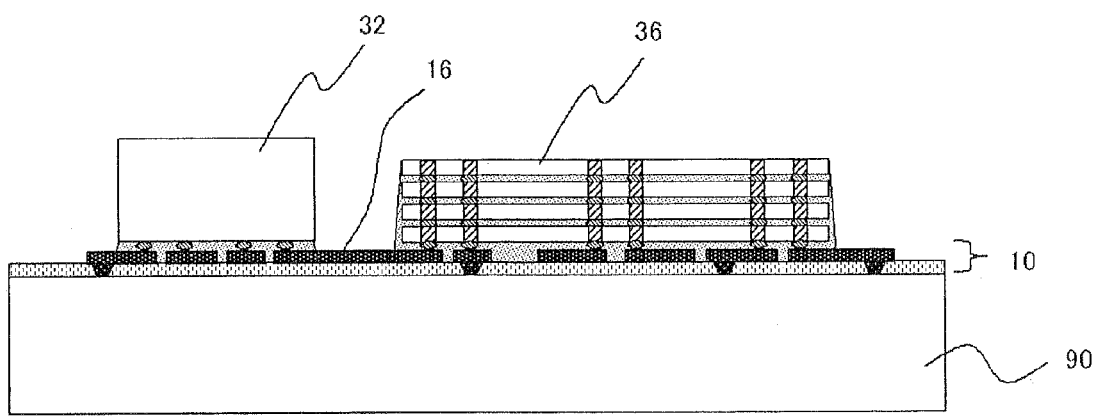

Referring now to FIGS. 4A to 7B, the manufacturing method will be described in further details. Firstly the insulating resin 14 is provided on the supporting substrate 90, and the via plugs 12b are formed in the insulating resin 14. Then the conductor interconnect 16 is formed on the insulating resin 14 (FIG. 4A). The IC chips 32, 36 are then flip-chip mounted on the conductor interconnect 16 (FIG. 4B). Thereafter, the encapsulating resin 52 is provided on the interconnect layer 10 so as to cover the IC chips 32, 36. The encapsulating resin 52 may be formed by molding, printing or potting, for example (FIG. 5A). Then the supporting substrate 90 is removed, so as to expose the via plug 12b (FIG. 5B).

Figure 6A:
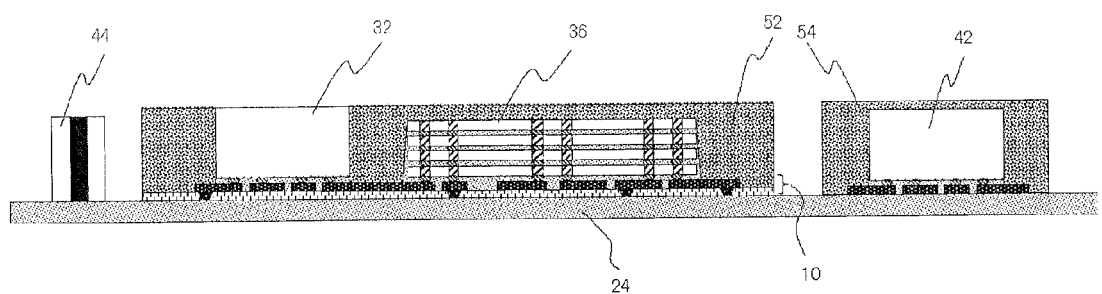
FIGS. 6A and 6B are cross-sectional views sequentially showing the manufacturing method of the electronic device according to the first embodiment.
Figure 6B:
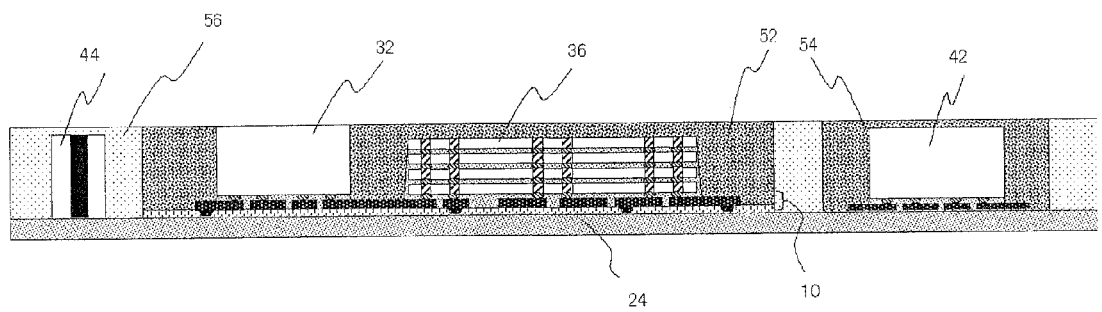

On the lower surface of the interconnect layer 10, on which the supporting substrate 90 was initially provided, the insulating resin 24 is formed so as to extend to an outer region of the interconnect layer 10. The insulating resin 24 may be constituted of an insulative film. Then the IC chip 42 and the passive component 44 are implemented on a region of the insulating resin 24 outwardly extending from the interconnect layer 10. The encapsulating resin 54 is then formed so as to cover the IC chip 42 (FIG. 6A). In addition, the resin 56 is provided so as to fill in the gap remaining on the region of the insulating resin 24 outwardly extending from the interconnect layer 10. Thus, the passive component 44 is covered with the resin 56 (FIG. 6B).

Figure 7A:
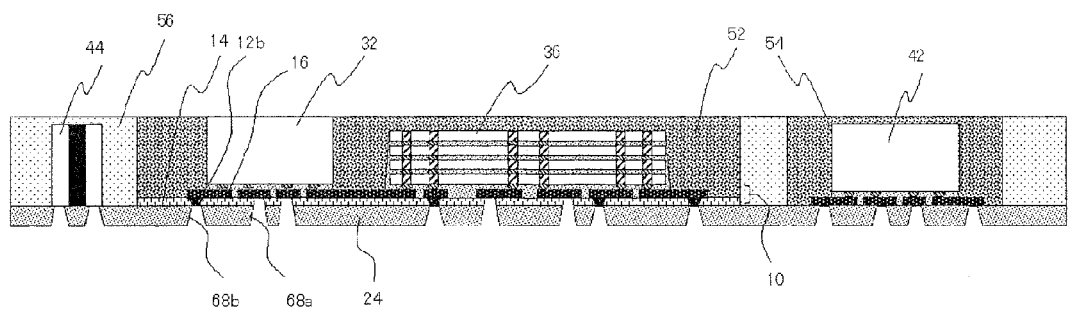
FIGS. 7A and 7B are cross-sectional views sequentially showing the manufacturing method of the electronic device according to the first embodiment.

Then a via hole 68a for the via plug 12, and a via hole 68b for the via plug 22b are formed. The via hole 68a is formed so as to penetrate not only through the insulating resin 24 but also through the insulating resin 14 (FIG. 7A). The via plug 12 and the via plug 22b are then formed, so as to fill in the via hole 68a, 68b. Thus in this embodiment, the via plugs 12a, 22a are formed into the via plug 12 of a unified structure, in the process of forming the interconnect layer 20.

Figure 7B:
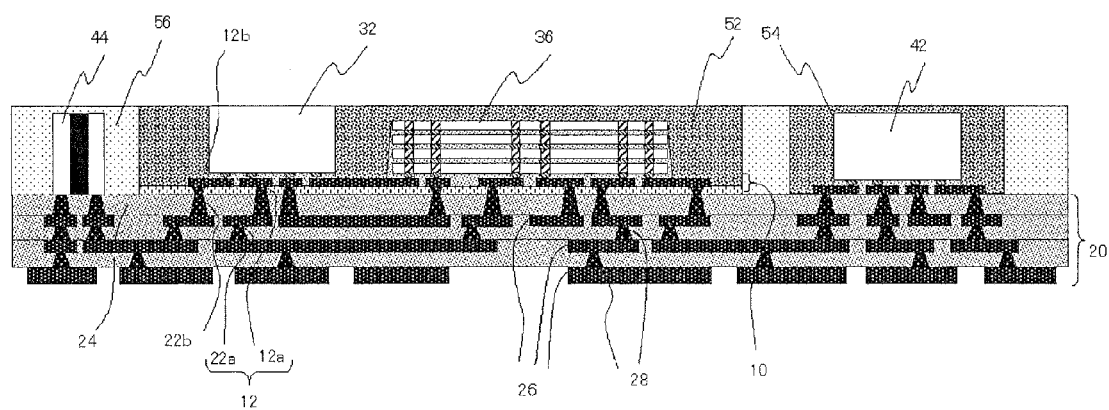

Then a build-up interconnect layer is formed on the insulating resin 24. Examples of the formation process of the build-up interconnect include alternately forming the conductor interconnect 26 by a semi-additive process and the via plug 28 by laser processing, in an insulating resin layer such as an epoxy resin. Through such process, the interconnect layer 20 is obtained (FIG. 7B). Thereafter, by forming the solder resist 62 and the solder balls 60, the electronic device 1 as shown in FIG. 1 can be obtained.

As may be understood from the foregoing description, while the via plug 12b is formed in the via hole formed from an upper direction in each drawing, the via plugs 12a, 22a, 22b are formed in the via hole formed from a lower direction. Accordingly, the via plug 12b has, as already stated, a larger end face on the side of the IC chips 32, 36 than that on the opposite side, and the via plugs 12a, 22a, 22b have a larger end face on the side of the solder balls 60, than that on the opposite side.

This embodiment provides the following advantageous effects. By the foregoing manufacturing method, the interconnect layer 10 on which the IC chips 32, 36 are mounted, is formed on the supporting substrate 90, and then the supporting substrate 90 is removed before forming the interconnect layer 20. Such arrangement eliminates the restriction that a resin lower in thermal decomposition temperature than the insulating resin 14 cannot be employed as the insulating resin 24. The method allows, therefore, employing a resin appropriate for micro processing as the insulating resin 14, while employing a relatively inexpensive resin as the insulating resin 24. Thus, the above embodiment provides a method of manufacturing the electronic device 1 that enables achieving fine connection between the interconnect layer 10 and the IC chips 32, 36, despite a lower cost.

Besides, the via plug 12a to be provided in the interconnect layer 10 is formed during the formation process of the interconnect layer 20, not the interconnect layer 10. Such arrangement allows forming the via plug 12a at the same time as forming the conductive materials (via plugs 22a, 22b in this embodiment) provided in the interconnect layer 20, thereby facilitating reducing the number of manufacturing steps. The foregoing process also facilitates forming the via hole. Referring to FIG. 7A for further details on this aspect, the via hole 68b has to be formed with higher positional accuracy, because the via hole 68b has to fall on the via plug 12b already provided. On the other hand, the via hole 68a is to be connected to the conductor interconnect 16 which is larger in area than the via plug 12b, and hence the same level of accuracy as with the via hole 68b is not required. For such reason, forming the via plug 12a and the via plug 22a at a time facilitates forming the via hole.

Figure 5A:
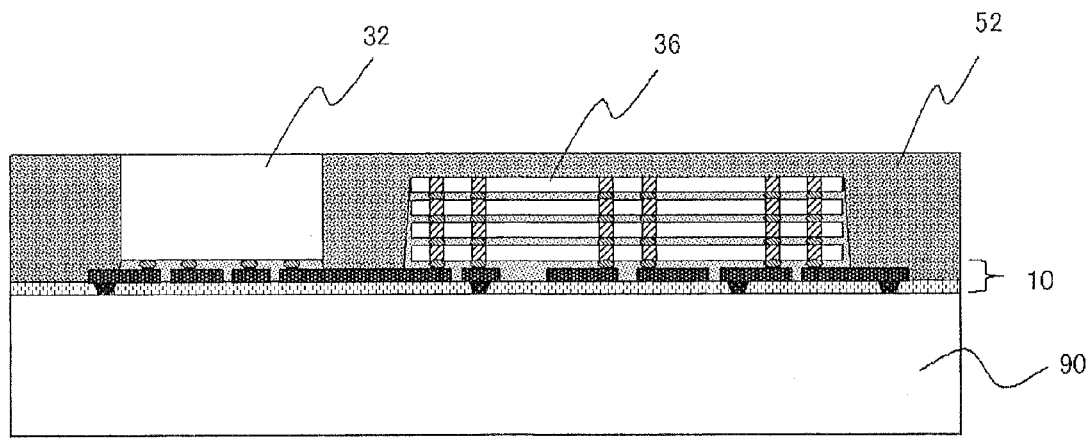
FIGS. 5A and 5B are cross-sectional views sequentially showing the manufacturing method of the electronic device according to the first embodiment.
Figure 5B:
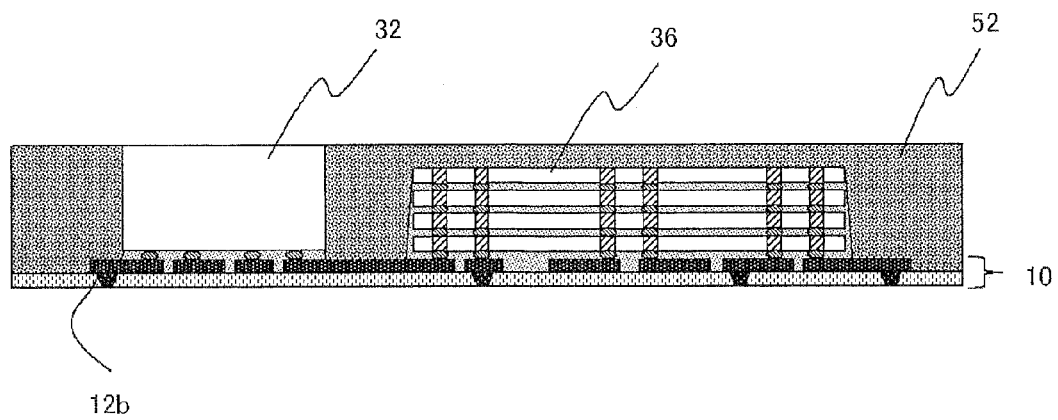

Also, via plug 12b is exposed when the supporting substrate 90 is removed (Ref. FIG. 5B). Therefore, the via plug 12b can be utilized as a terminal when performing an electrical inspection right after removing the supporting substrate 90, which enables detecting a defect, if any, in the electronic device under process, at an earlier stage. Here, it is not imperative to form the via plug 12b in this way. Alternatively, all the via plugs in the interconnect layer 10 may be formed during the formation process of the interconnect layer 20.

The interconnect layer 20 extends to an outer region of the interconnect layer 10. Such structure allows securing a sufficient area for providing the solder balls 60 (i.e. lower surface of the interconnect layer 20), while keeping the interconnect layer 10 as small as possible. Accordingly, the electronic device 1 can be easily mounted on another electronic device or a mother board, without incurring any increase in cost. In contrast, in the case where the interconnect layer 10 and the interconnect layer 20 have the same area, expanding the interconnect layer 20 to facilitate the mounting process inevitably leads to an increase in area of the interconnect layer 10. This naturally leads to an increase in manufacturing cost of the electronic device 1, since the relatively expensive resin appropriate for micro processing is employed to constitute the interconnect layer 10. Reducing the area of the interconnect layer 10 in the attempt to reduce the cost, on the other hand, compels the interconnect layer 20 to be smaller in area, thus degrading the mounting facility. Thus, the foregoing embodiment eliminates such contradiction and achieves both the lower cost and mounting facility.

Because of the rigid structure of the supporting substrate 90 on which the pattern of the conductor interconnect 16 is formed, the conductor interconnect 16 can be formed in a sufficiently fine pattern. Also, since connection of the interconnect layer 10 and the IC chips 32, 36 is performed on the supporting substrate 90 which is rigid, the interconnect layer 10 and the IC chips 32, 36 can be connected via bumps in a fine pitch. This contributes to decreasing the number of interconnect layers, and to reducing the size of the IC chips 32, 36.

Further, since the interconnect layer 20 is formed after removing the supporting substrate 90, the insulating resin 24, provided for forming the interconnect layer 20, can be formed in a greater thickness than the insulating resin 14. Accordingly, the insulating resin 24 attains higher stress relief capability, which leads to higher reliability of the electronic device 1.

In the step of forming the second interconnect layer, a resin lower in thermal decomposition temperature than the insulating resin 14 employed in the step of forming the first interconnect layer for forming the interconnect layer 10 is employed as the insulating resin 24 for forming the interconnect layer 20. Such arrangement allows appropriately forming the interconnect layer 20 on the interconnect layer 10.

In the electronic device 1, a resin that is lower in thermal decomposition temperature than the insulating resin 14 forming the interconnect layer 10 can be employed as the insulating resin 24 for forming the interconnect layer 20. Accordingly, a resin appropriate for micro processing may be employed as the insulating resin 14, while a relatively inexpensive resin may be employed as the insulating resin 24.

Thus, the electronic device 1 enables achieving fine connection between the interconnect layer 10 and the IC chips 32, 36 despite a lower cost.

In the electronic device 1, the interconnect layer 10 and the interconnect layer 20 are in direct contact with each other, without a core layer provided therebetween. Generally, a via plug formed in the core layer is more difficult to micronize than those formed in an ordinary interconnect layer, and hence providing the core layer impedes the micronization of the electronic device as a whole. The electronic device 1, which does not include the core layer, is free from such drawback.

The encapsulating resin 52 is provided so as to cover the IC chips 32, 36. Such structure allows retaining the shape of the interconnect structure after the removal of the supporting substrate 90. Accordingly, the solder balls 60 can attain high coplanarity. In this embodiment in particular, also the resin 56 is provided on the region of the interconnect layer 20 outwardly extending from the interconnect layer 10, which enhances the foregoing effect.

Employing a silicon substrate as the supporting substrate 90 minimizes an effect of thermal expansion, compared with an insulating substrate. Such structure, therefore, facilitates further micronizing the connection between the interconnect layer 10 and the IC chips 32, 36.

Employing a polyimide resin, a PBO resin, a BCB resin or a cardo resin as the insulating resin 14 grants the insulating resin 14 with properties appropriate for micro processing. Employing an epoxy resin as the insulating resin 24 allows forming the insulating resin 24 at a low cost.

The adhesion metal layer 72 is provided so as to cover the via plug 12 (Ref. FIG. 2). The adhesion metal layer 72 serves to secure firm adhesion between the via plug 12 and the insulating resin 14, 24. Also, the adhesion metal layer 74 is provided on the surface of the conductor interconnect 16 in contact with the via plug 12 (Ref. FIG. 2). The adhesion metal layer 74 also assures firm adhesion between the conductor interconnect 16 and the insulating resin 14. Further, the adhesion metal layer 75 is provided so as to cover the via plug 28 (Ref. FIG. 2). The adhesion metal layer 75 assures firm adhesion between the via plug 28 and the insulating resin 24. The firm adhesion naturally leads to upgraded reliability of the electronic device 1. When the adhesion metal layers 72, 74, 75 contain Ti, or are constituted of Cr, the adhesion metal layers 72, 74, 75 can achieve prominently firm adhesion to the resin.

The IC chip 42 and the passive component 44 are mounted on the region of the interconnect layer 20 outwardly extending from the interconnect layer 10. Such structure can further upgrade the function and performance of the electronic device 1.

Second Embodiment

Figure 8:
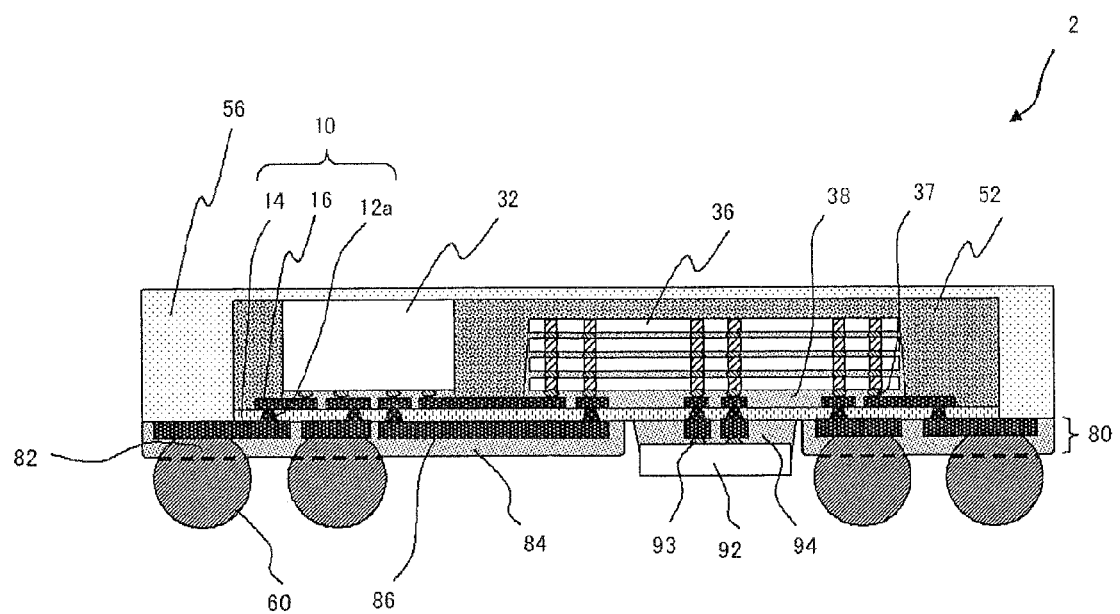
FIG. 8 is a cross-sectional view of an electronic device according to a second embodiment of the present invention.

FIG. 8 is a cross-sectional view of an electronic device according to a second embodiment of the present invention. The electronic device 2 includes the interconnect layer 10 (first interconnect layer), and an interconnect layer 80 (second interconnect layer). The interconnect layer 10 has a similar structure to that described referring to FIG. 1, except for not including the via plug 12b.

The interconnect layer 80 is provided on the lower surface of the interconnect layer 10, so as to extend to an outer region of the interconnect layer 10. The interconnect layer 80 includes a solder resist 84, and a conductor interconnect 86 (second interconnect) formed in the solder resist 84. The conductor interconnect 86 is connected to the via plug 12a.

The conductor interconnect 86 and the via plug 12*a* are integrally formed. The solder resist 84 is constituted of a resin lower in thermal decomposition temperature than the insulating resin 14. The interconnect layer 80 includes via plugs 82 (second conductive plug) connected to the conductor interconnect 86. The via plug 82 corresponds to a portion of the solder ball 60, more specifically a portion thereof buried in the solder resist 84. As is apparent from FIG. 8, the via plugs 82 are of a tapered shape, having a diameter gradually reducing toward the interconnect layer 10. Accordingly, an end face of the via plug 82 on the side of the interconnect layer 10 is smaller in area than the opposite end face.

Also, on the lower surface of the interconnect layer 10 an IC chip 92 is flip-chip mounted. In other words, the IC chip 92 is connected to the lower surface via a bump 93, and a gap between the interconnect layer 10 and the IC chip 92 is filled with an underfill resin 94. On a region of the interconnect layer 80 outwardly extending from the interconnect layer 10, the resin 56 is provided. In this embodiment, the resin 56 covers both the lateral and the upper surface of the encapsulating resin 52.

Figure 9A:
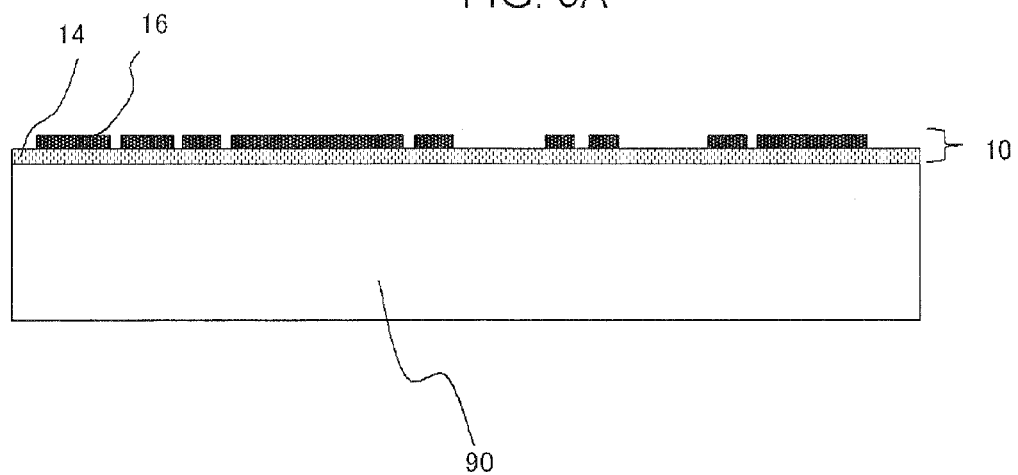
FIGS. 9A and 9B are cross-sectional views sequentially showing a manufacturing method of the electronic device according to the second embodiment.
Figure 9B:
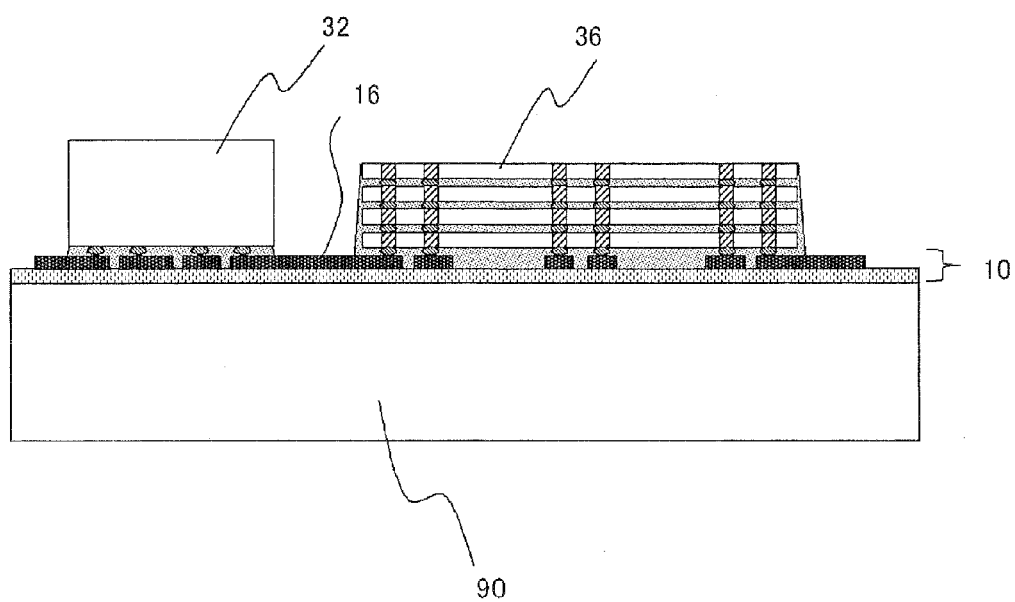

Referring to FIGS. 9A to 12B, a method of manufacturing the electronic device 2 will be described, as the second embodiment of the method of manufacturing an electronic device according to the present invention. Firstly, the insulating resin 14 and the conductor interconnect 16 is formed on the supporting substrate 90 (FIG. 9A). Then the IC chips 32, 36 are flip-chip mounted on the conductor interconnect 16 (FIG. 9B).

Figure 10A:
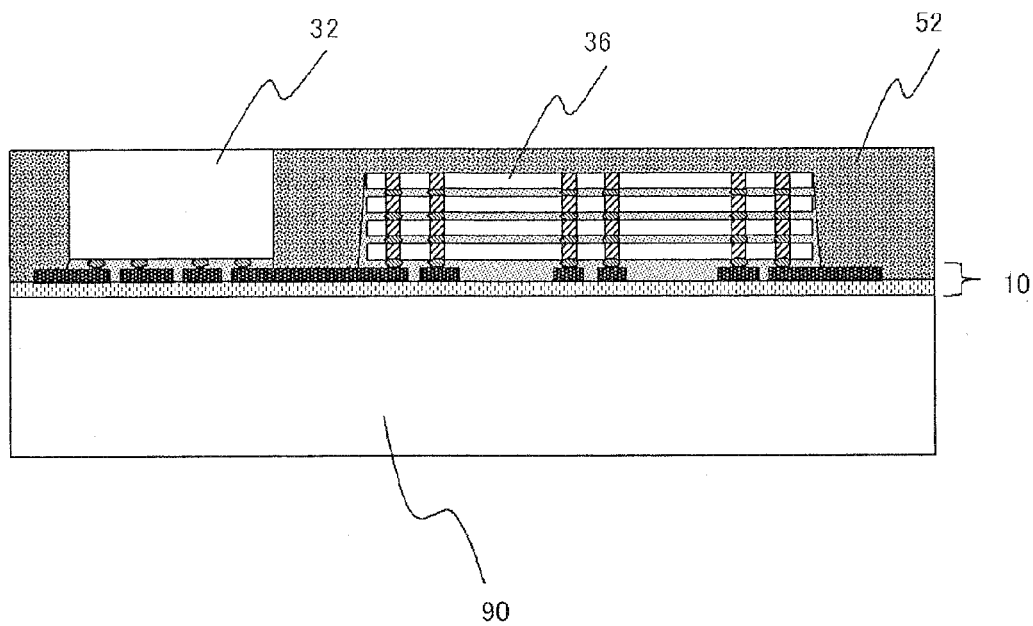
FIGS. 10A and 10B are cross-sectional views sequentially showing a manufacturing method of the electronic device according to the second embodiment.
Figure 10B:
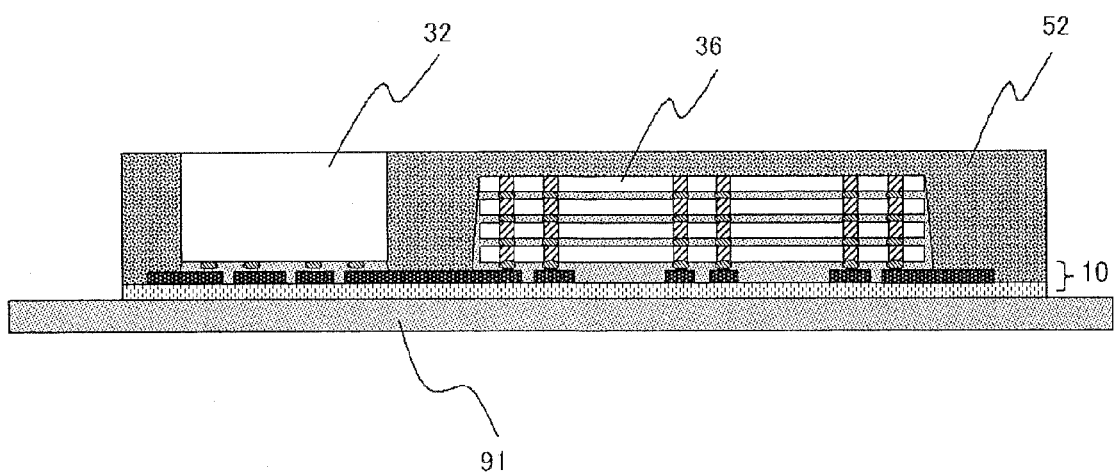

Thereafter, the encapsulating resin 52 is formed on the interconnect layer 10, so as to cover the IC chips 32, 36 (FIG. 10A). The supporting substrate 90 is then removed. A supporting sheet 91 is provided on the lower surface of the interconnect layer 10, so as to extend outward from the interconnect layer 10 (FIG. 10B).

Figure 11A:
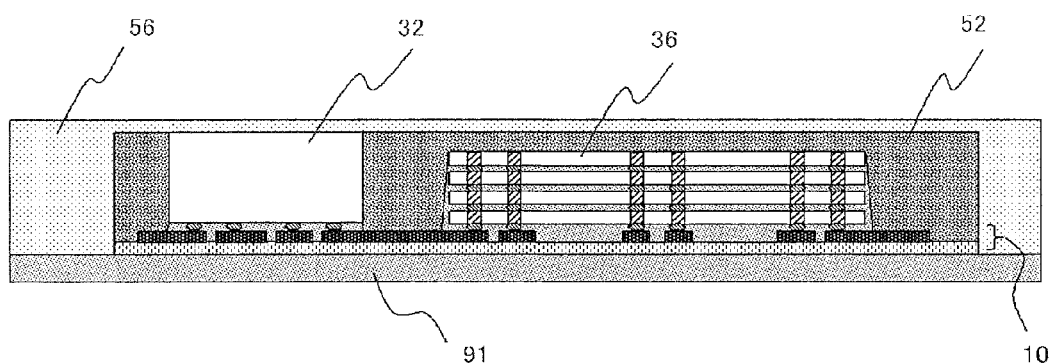
FIGS. 11A to 11C are cross-sectional views sequentially showing a manufacturing method of the electronic device according to the second embodiment.
Figure 11B:
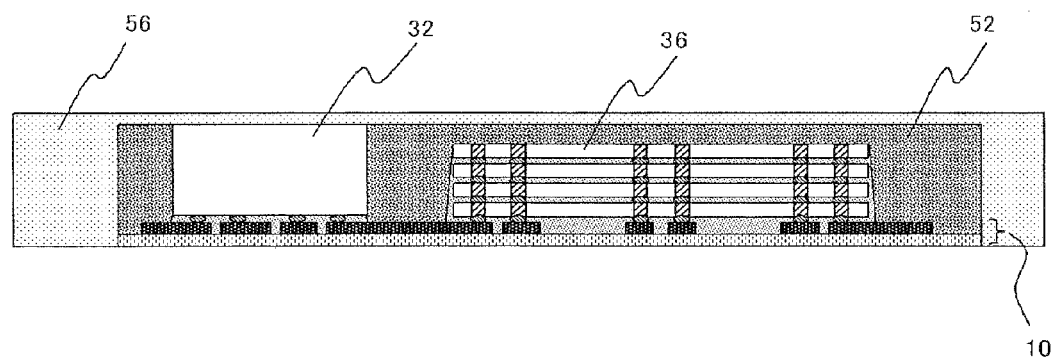
Figure 11C:
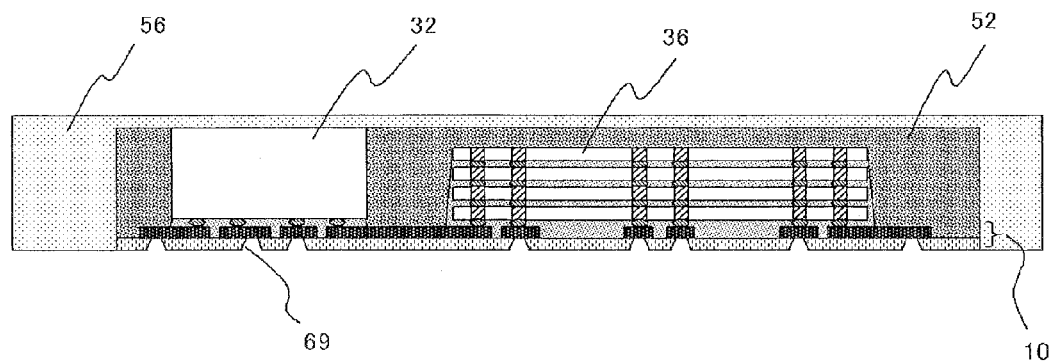

Then the resin 56 is provided so as to cover the encapsulating resin 52, on a region of the supporting sheet 91 outside of the interconnect layer 10 (FIG. 11A). Thereafter, the supporting sheet 91 is stripped off (FIG. 11B). The via hole 69 for the via plug 12*a* is then formed (FIG. 11C), and the via plug 12*a* and the conductor interconnect 86 are formed so as to fill in the via hole 69. Thus, in this embodiment, the via plug 12*a* and the conductor interconnect 86 are simultaneously formed as a unified conductive material, during the formation process of the interconnect layer 80.

Figure 12A:
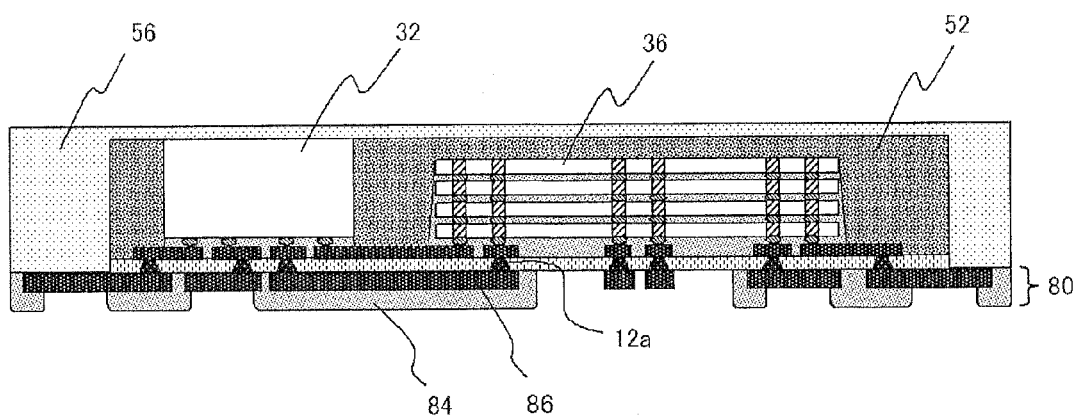
FIGS. 12A and 12B are cross-sectional views sequentially showing a manufacturing method of the electronic device according to the second embodiment.
Figure 12B:
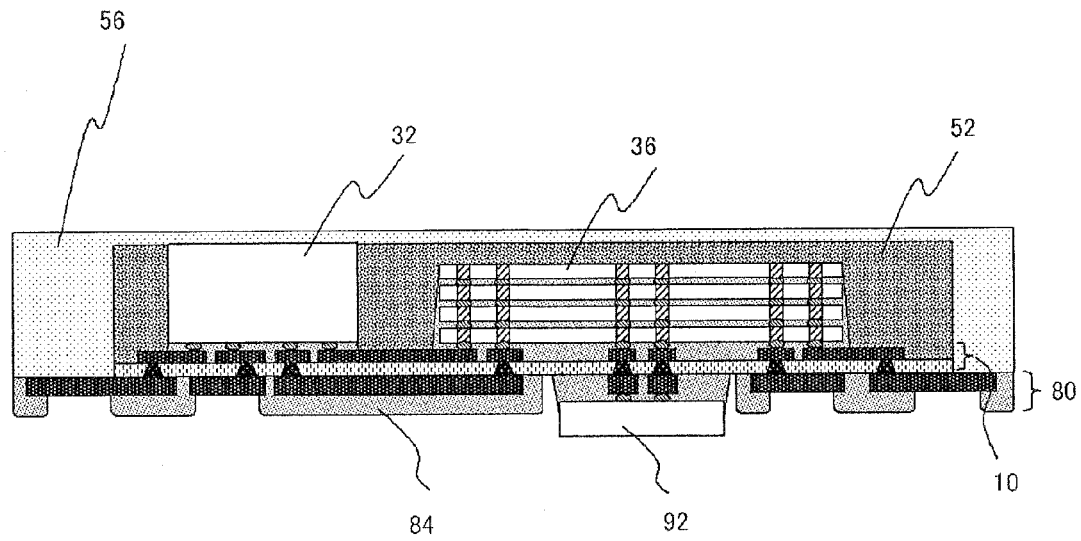

After that, the solder resist 84 is provided so as to cover the conductor interconnect 86. The solder resist 84 is then patterned, so as to form openings where the solder balls 60 are to be provided and the IC chip 92 are to be mounted (FIG. 12A). At this stage, the interconnect layer 80 is obtained. Then the IC chip 92 is flip-chip mounted on the lower surface of the interconnect layer 10 (FIG. 12B). By forming the solder balls 60 thereafter, the electronic device 2 shown in FIG. 8 can be obtained.

This embodiment provides the following advantageous effects, in addition to those offered by the first embodiment. Since the solder resist 84 is employed as the resin for forming the interconnect layer 80, the cost of the electronic device 2 can be further reduced. Also, the electronic component (IC chip 92) is implemented not only on the upper surface of the interconnect layer 10, but also on the lower surface thereof. Such structure further upgrades the function and performance of the electronic device 2. Here, although the bump 93 is connected to the via plug 12*a* through the conductor interconnect 86 as shown in FIG. 8, the bump 93 may be directly connected to the via plug 12*a*.

Third Embodiment

Figure 13:
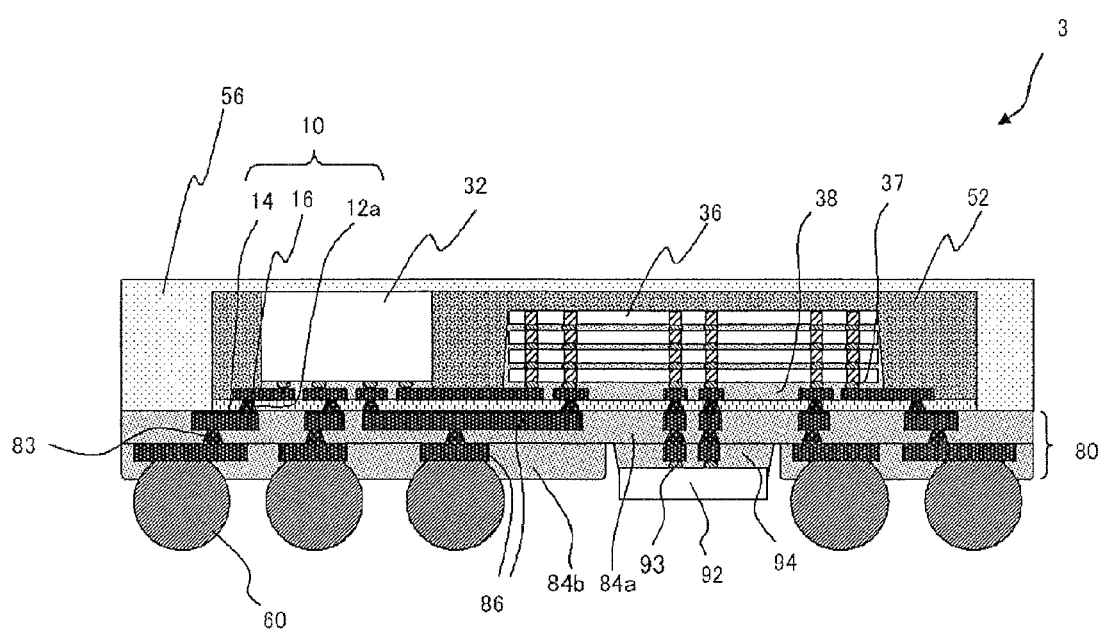
FIG. 13 is a cross-sectional view of an electronic device according to a third embodiment of the present invention.

FIG. 13 is a cross-sectional view of an electronic device according to a third embodiment of the present invention. The electronic device 3 includes the interconnect layer 10, and the interconnect layer 80. The electronic device 3 is different from the electronic device 2 shown in FIG. 8, in that the interconnect layer 80 has a multilayer interconnect structure. In this embodiment the interconnect layer 80 includes an insulating resin 84*a* provided on the lower surface of the interconnect layer 10, and a solder resist 84*b* provided on the insulating resin 84*a*.

The interconnect layer 80 according to this embodiment includes conductor interconnects 86 provided in a plurality of layers, and via plugs 83 (second conductive plug) connected to the conductor interconnect 86. As is apparent from FIG. 13, the via plugs 83 are of a tapered shape having a diameter gradually reducing toward the interconnect layer 10. Accordingly, an end face of the via plug 83 on the side of the interconnect layer 10 is smaller in area than the opposite end face. The structure of the remaining portion of the electronic device 3 is similar to that of the electronic device 2.

Figure 14A:
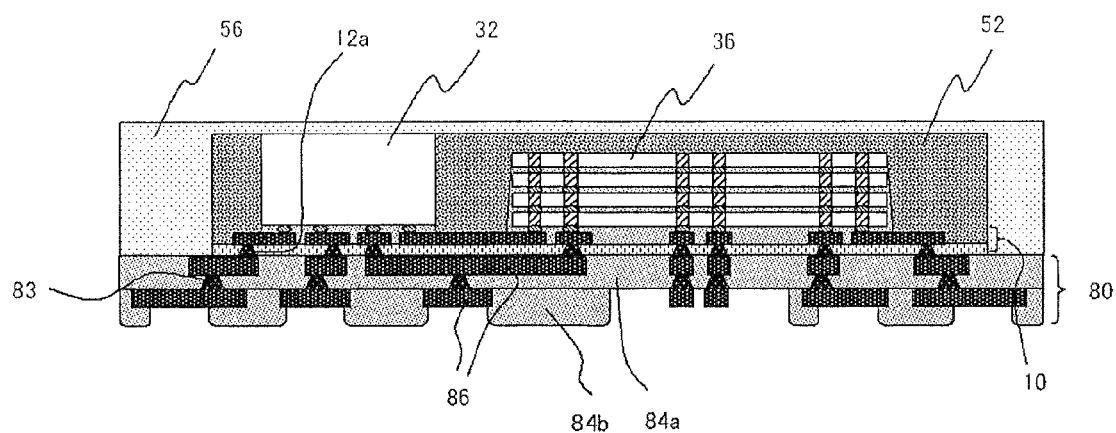
FIGS. 14A and 14B are cross-sectional views sequentially showing a manufacturing method of the electronic device according to the third embodiment.
Figure 14B:
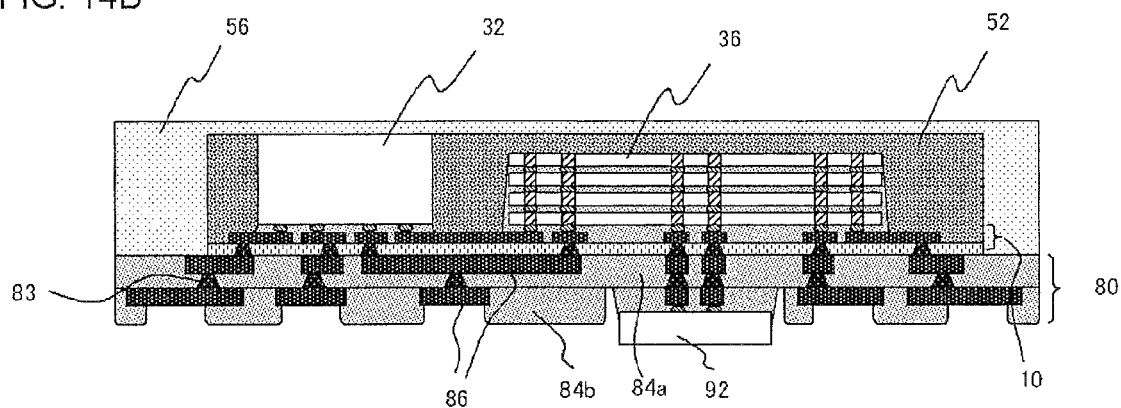

Referring to FIGS. 14A and 14B, a method of manufacturing the electronic device 3 will be described, as the third embodiment of the method of manufacturing an electronic device according to the present invention. Firstly, the structure shown in FIG. 11B is formed, through the process described referring to FIGS. 9A to 11B.

Then via plug 12*a* and a first layer of the conductor interconnect 86 are formed at a time. The insulating resin 84*a* is then provided, so as to cover the conductor interconnect 86. Further in the insulating resin 84*a*, the via plug 83 is formed so as to be connected to the conductor interconnect 86. Then a second layer of the conductor interconnect 86 is formed on the insulating resin 84*a*, so as to be connected to the via plug 83. After that, the solder resist 84*b* is provided so as to cover the second layer of the conductor interconnect 86.

Then the solder resist 84*b* is patterned to thereby provide openings at positions where the solder balls 60 are to be formed and the IC chip 92 is to be implemented (FIG. 14A). At this stage, the interconnect layer 80 is obtained. Thereafter, the IC chip 92 is flip-chip mounted on the insulating resin 84*a* (FIG. 14B). By forming the solder balls 60 thereafter, the electronic device 3 shown in FIG. 13 can be obtained. This embodiment provides the same advantageous effects as those offered by the second embodiment. Here, although the bump 93 is connected to the via plug 83 through the conductor interconnect 86 as shown in FIG. 13, the bump 93 may be directly connected to the via plug 83.

The electronic device and the manufacturing method thereof according to the present invention are not limited to the foregoing embodiments, but various modifications may be made. Although the foregoing embodiments adopt the IC chips as an example of the electronic component to be mounted on the upper or lower surface of the interconnect structure including the first and the second interconnect layer to cite a few examples, the electronic component may be a passive component such as a capacitor. Also, the electronic device does not imperatively have to include the electronic component.

Although the solder balls are provided in the electronic device according to the embodiments, providing the solder balls is not mandatory. In the case where the solder balls are not provided, a land portion of the conductor interconnect serves as an external electrode terminal. Referring to the electronic device 1 shown in FIG. 1 as an example, the portions of the conductor interconnect 26 in contact with the solder balls 60 correspond to the land portion.

In the foregoing embodiments, the second interconnect layer extends to an outer region of the first interconnect layer. Such configuration is, however, not mandatory, but the first and the second interconnect layer may be have the same area in a plan view.

Figure 15:
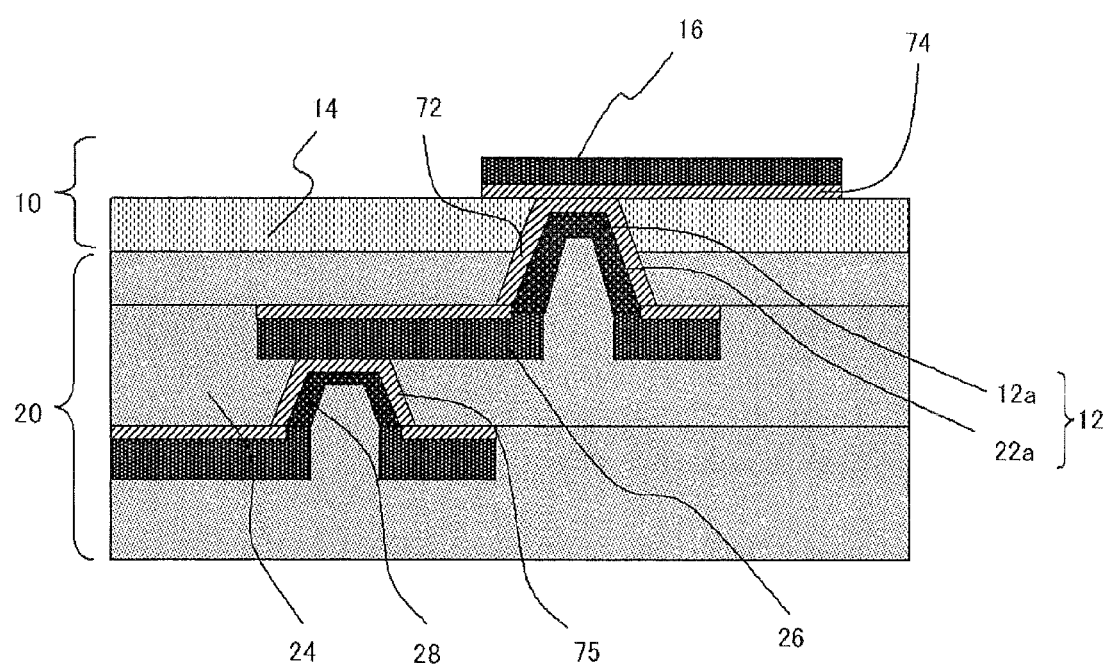
FIG. 15 is a cross-sectional view for explaining a variation of the embodiment.

The structure around the interface between the first and the second interconnect layer may also be modified in various manners, without limitation to the structure shown in FIG. 2. For example, in the embodiments, the conductive material is loaded in the entirety of the via hole, to form the via plug. However, the via hole may be partially filled with the conductive material. FIG. 15 depicts the structure as FIG. 2 but in which the via plugs 12, 28 are formed by partially filling the relevant via holes. Here, although the via hole is partially filled with the conductive material, the area of the end face of the via plug is defined as the area of the region enclosed by the outer circumference of the end face. Accordingly, as long as the size of the via hole is the same, the area of the end face is also the same, irrespective of whether the conductive material is filled in a part or the whole of the via hole.

Figure 16:
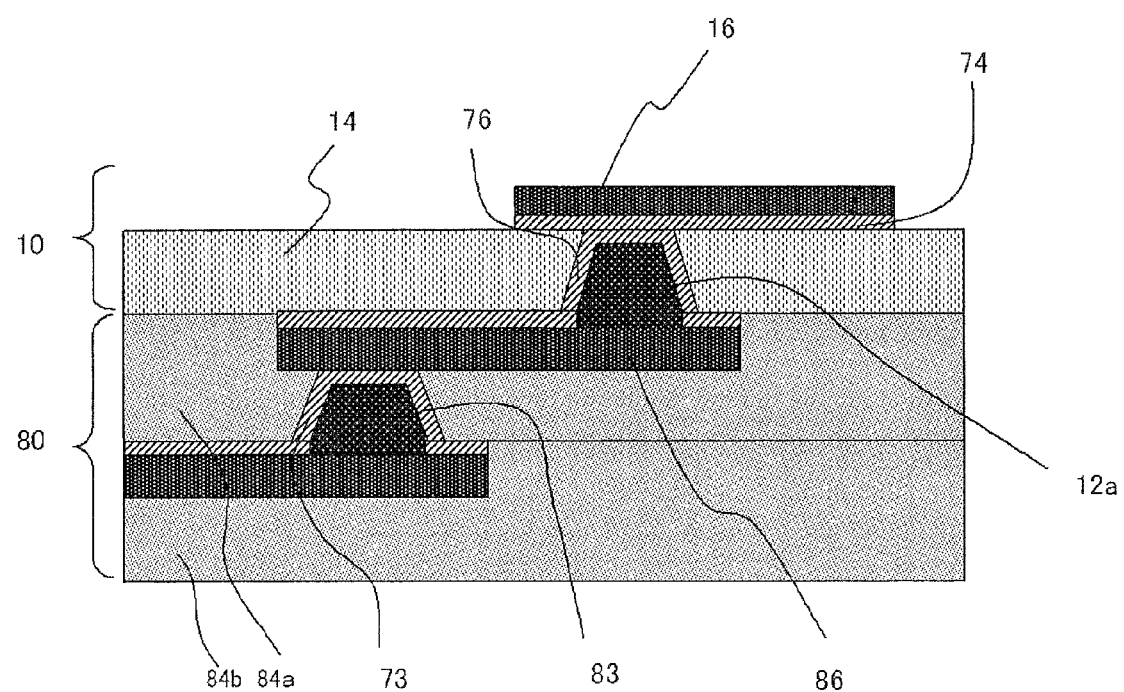
FIG. 16 is a cross-sectional view for explaining another variation of the embodiment.

Further, as shown in FIG. 16, an adhesion metal layer 76 (second adhesion metal layer) may be provided so as to collectively cover the via plug 12a and the conductor interconnect 86. The adhesion metal layer 76 is in contact with the adhesion metal layer 74 on the via plug 12a. Thus, the entirety of the adhesion metal layer 76 is in contact with the insulating resin 14 or the adhesion metal layer 74. Providing thus the adhesion metal layer 76 assures firm adhesion between the via plug 12a and the insulating resin 14. Also, in FIG. 16, an adhesion metal layer 73 is provided so as to cover the via plug 83 (Ref. FIG. 13). The adhesion metal layer 73 is in contact with the conductor interconnect 86 on the via plug 83. Providing thus the adhesion metal layer 73 assures firm adhesion between the via plug 83 and the insulating resin 84a. The adhesion metal layer 73, 76 may be formed of a similar film to that employed as the adhesion metal layer 72, 74, 75.

It is apparent that the present invention is not limited to the above embodiment, and may be modified and changed without departing from the scope and spirit of the invention.

What is claimed is:

1. A method of manufacturing an electronic device, comprising:
    forming a first interconnect layer on a supporting substrate, said first interconnect layer having an outermost insulating layer contacting the supporting substrate;
    mounting an electronic component on an upper surface of said first interconnect layer, after forming said first interconnect layer on said supporting substrate and before removing said supporting substrate, said electronic component being an IC chip;
    removing said supporting substrate to expose said outermost insulating layer; and
    forming, after said removing said supporting substrate, a second interconnect layer by a build-up process on a surface of said outermost insulating layer on which said supporting substrate was initially provided,
    wherein said forming said second interconnect layer includes forming a first conductive plug extending into said outermost insulating layer.

2. The method according to claim 1, further comprising: forming an encapsulating resin on said first interconnect layer so as to cover said electronic component, between said mounting an electronic component and said removing said supporting substrate.

3. The method according to claim 1, wherein said forming a second interconnect layer includes employing, for forming said second interconnect layer, a resin lower in thermal decomposition temperature than a resin employed in said forming a first interconnect layer for forming said first interconnect layer.

4. The method according to claim 1, wherein said forming a second interconnect layer includes forming a second conductive plug located in said second interconnect layer; and said forming a first conductive plug and said forming a second conductive plug are simultaneously executed so as to form a unified conductive plug.

5. The method according to claim 1, wherein said forming a second interconnect layer includes forming an interconnect located in said second interconnect layer; and said forming a first conductive plug and said forming an interconnect are simultaneously executed so as to form a unified conductive material.

6. The method according to claim 1, wherein said supporting substrate is a silicon substrate.

7. The method according to claim 1, wherein said forming said first conductive plug extending into said outermost insulating layer includes contacting said first conductive plug to a conductive interconnect of said first interconnect layer.

8. The method according to claim 1, wherein said build-up process includes alternately forming a conductor interconnect and a via plug, in an insulating resin layer.

9. The method according to claim 1, wherein said forming said second interconnect layer includes forming said first conductive plug extending into said outermost insulating layer without extending into additional layers of said first interconnect layer.

10. The method according to claim 1, wherein,
    said step of forming a first interconnect layer on a supporting substrate comprises forming said outermost insulating layer contacting the supporting substrate and then forming a first conductor interconnect on and extending across said outermost insulating layer,
    forming said second interconnect layer includes forming a multilayer interconnect structure comprised of plural insulating resin layers with plural second conductor interconnects layered one over another and connected to each other by via plugs,
    said forming said second interconnect layer includes forming a first conductive plug extending into said outermost insulating layer, said first conductive plug connecting an uppermost one of said second conductor interconnects to said first conductor interconnect, and
    said step of mounting an electronic component on said first interconnect layer comprises mounting plural of said electronic component on said first conductor interconnect of said first interconnect layer so that said first conductor interconnect connects said electronic components to each other.

11. A method of manufacturing an electronic device, comprising:
    forming a first interconnect layer on a supporting substrate;
    mounting an electronic component on said first interconnect layer, after forming said first interconnect layer on said supporting substrate and before removing said supporting substrate;
    removing said supporting substrate; and forming, after said removing said supporting substrate, a second interconnect layer on a surface of said first interconnect layer on which said supporting substrate was initially provided, wherein, said forming said second interconnect layer includes forming a hole so as to penetrate through a second insulating resin layer of said second interconnect layer and a first insulating resin layer of said first interconnect layer, and filling in said hole to form a conductive plug.

12. A method of manufacturing an electronic device, comprising:

forming a first insulating resin layer on a supporting substrate;

forming a conductive interconnect on said first insulating resin layer;

mounting an electronic component on said first insulating resin layer, after forming said conductive interconnect on said first insulating resin layer and before removing said supporting substrate;

removing said supporting substrate; and forming, after said removing said supporting substrate, a second interconnect layer on a surface of said first insulating resin layer on which said supporting substrate was initially provided, wherein, said forming said second interconnect layer includes forming a hole reaching a surface of said conductive interconnect so as to penetrate through said first insulating resin layer, and filling in said hole to form a conductive plug.

* * * * *